US009977748B2

(12) United States Patent
Luna et al.

(10) Patent No.: US 9,977,748 B2
(45) Date of Patent: May 22, 2018

(54) MANAGING STORAGE OF DIGITAL CONTENT

(71) Applicant: LENOVO (Singapore) PTE, LTD., New Tech Park (SG)

(72) Inventors: Joaquin F. Luna, Durham, NC (US); Marco Alberto Gonzalez, Durham, NC (US); Scott Wentao Li, Cary, NC (US); Grigori Zaitsev, Durham, NC (US)

(73) Assignee: Lenovo (Singapore) PTE. LTD., New Tech Park (SG)

( * ) Notice: Subject to any disclaimer, the term of this patent is extended or adjusted under 35 U.S.C. 154(b) by 49 days.

(21) Appl. No.: 14/744,502

(22) Filed: Jun. 19, 2015

(65) Prior Publication Data

US 2016/0371293 A1    Dec. 22, 2016

(51) Int. Cl.
*G06F 12/12* (2016.01)
*G06F 12/123* (2016.01)
*G06F 12/121* (2016.01)
*H03M 7/30* (2006.01)

(52) U.S. Cl.
CPC .......... *G06F 12/125* (2013.01); *G06F 12/121* (2013.01); *H03M 7/30* (2013.01); *H03M 7/3059* (2013.01)

(58) Field of Classification Search
CPC ........ G06F 12/00; G06F 12/12; G06F 12/121; G06F 12/127
USPC .......................................... 711/100, 154, 159
See application file for complete search history.

(56) References Cited

U.S. PATENT DOCUMENTS

| 6,173,381 | B1 * | 1/2001 | Dye ........................ G06F 12/08 345/555 |
| 6,243,766 | B1 * | 6/2001 | Sliger ....................... G06F 8/68 341/51 |
| 7,620,785 | B1 * | 11/2009 | Coulter ............... G06F 11/1471 711/161 |
| 9,053,100 | B1 * | 6/2015 | Malige .................... H03M 7/30 |
| 2008/0253330 | A1 * | 10/2008 | Bartlett ................... H04L 69/04 370/331 |
| 2011/0080956 | A1 * | 4/2011 | Zhou ...................... H04N 19/61 375/240.24 |
| 2013/0179410 | A1 * | 7/2013 | Amit ................. G06F 17/30153 707/693 |
| 2014/0105271 | A1 * | 4/2014 | Fallon ..................... H03M 7/30 375/240 |
| 2015/0088945 | A1 * | 3/2015 | Kruus ..................... H03M 7/30 708/203 |

(Continued)

Primary Examiner — Tuan Thai
(74) Attorney, Agent, or Firm — Kunzler, PC

(57) ABSTRACT

Apparatuses, methods, systems, and program products are disclosed for managing storage of digital content. An eligibility module determines one or more content elements that are eligible for compression. A content element is determined to be eligible for compression based on one or more characteristics of the content element. A rate module determines a compression rate for each of the one or more content elements. The compression rate comprises an amount of compression to be applied to a content element. The amount of compression to be applied to the content element is determined as a function of one or more characteristics of the content element. A compression module compresses each of the one or more eligible content elements according to the determined compression rate.

14 Claims, 5 Drawing Sheets

(56) References Cited

U.S. PATENT DOCUMENTS

2015/0227540 A1* 8/2015 Lin ................... G06F 17/30153
707/693
2016/0065241 A1* 3/2016 Ichien ................... G06F 3/0613
710/34

\* cited by examiner

MANAGING STORAGE OF DIGITAL CONTENT

FIELD

The subject matter disclosed herein relates to digital storage and more particularly relates to managing an amount of storage consumed by digital content.

BACKGROUND

Description of the Related Art

Digital content, such as images, videos, and music files can be stored by a user on remote servers of cloud service providers, such as YouTube® and Flickr®. Cloud service providers may provide a large amount of storage capacity for a user; however as the quality of digital content increases, so does the size of the digital content files that are stored. Accordingly, some cloud service providers may have a policy to delete a user's digital content to recover storage capacity, which may not be what the user desires or expects.

BRIEF SUMMARY

An apparatus for managing storage of digital content is disclosed. A method and computer program product also perform the functions of the apparatus. In one embodiment, an apparatus includes a processor and memory that stores code executable by the processor. In one embodiment, the apparatus includes code that determines one or more content elements that are eligible for compression. A content element may be determined to be eligible for compression based on one or more characteristics of the content element.

In a further embodiment, the apparatus includes code that determines a compression rate for each of the one or more content elements. The compression rate, in certain embodiments, comprises an amount of compression to be applied to a content element. The amount of compression to be applied to the content element may be determined as a function of one or more characteristics of the content element. In various embodiments, the apparatus includes code that compresses each of the one or more eligible content elements according to the determined compression rate.

In one embodiment, the apparatus includes code that determines an age of a content element. The age of the content element may comprise a characteristic of the content element. The content element may be determined to be eligible for compression in response to the determined age of the content element exceeding a threshold age. In some embodiments, the compression rate for the content element is determined as a function of the age of the content element.

In a further embodiment, the apparatus includes code that determines a popularity of a content element. The popularity may comprise a characteristic of the content element. The content element may be determined to be eligible for compression in response to the popularity of the content element being less than a popularity threshold. In some embodiments, the compression rate for the content element is determined as a function of the popularity of the content element. In a further embodiment, the popularity of a content element is determined based on user feedback associated with the content element. The user feedback may include a number of requests to access the content element, a number of comments associated with the content element, a number of times that the content element has been shared, and a number of likes associated with the content element.

The apparatus, in another embodiment, includes code that checks a compression flag associated with a content element. The compression flag may comprise a characteristic of the content element. The content element may be determined to be eligible for compression in response to the compression flag being set. The compression flag may be associated with an account for an owner of the content element such that the compression flag is settable by the owner in response to a type of the account comprising a premium account. The compression rate may be customizable by an owner of a content element that has a premium account.

In some embodiments, the apparatus further includes code that determines an amount of available storage capacity of a data center where the one or more content elements are stored. The amount of available storage capacity may comprise a characteristic of the content element. The compression rates for each of the one or more content elements may be determined as a function of the amount of available storage capacity. The apparatus, in another embodiment, includes code that determines a storage cost for one or more content elements. The storage cost may comprise a characteristic of the content element. The compression rate for a content element is determined as a function of a storage cost for the content element. In one embodiment, the one or more content elements comprise one or more of a document, a digital photograph, a video, and an audio file.

A method, in one embodiment, includes determining, by a processor, one or more content elements that are eligible for compression. A content element may be determined to be eligible for compression based on one or more characteristics of the content element. The method, in a further embodiment, includes determining a compression rate for each of the one or more content elements. The compression rate, in certain embodiments, comprises an amount of compression to be applied to a content element. The amount of compression to be applied to the content element may be determined as a function of one or more characteristics of the content element. In some embodiments, the method includes compressing each of the one or more eligible content elements according to the determined compression rate.

In one embodiment, the method includes determining an age of a content element. The age of the content element may comprise a characteristic of the content element. The content element may be determined to be eligible for compression in response to the determined age of the content element exceeding a threshold age. In some embodiments, the compression rate for the content element is determined as a function of the age of the content element.

In a further embodiment, the method includes determining a popularity of a content element. The popularity may comprise a characteristic of the content element. The content element may be determined to be eligible for compression in response to the popularity of the content element being less than a popularity threshold. In some embodiments, the compression rate for the content element is determined as a function of the popularity of the content element. In a further embodiment, the popularity of a content element is determined based on user feedback associated with the content element. The user feedback may include a number of requests to access the content element, a number of comments associated with the content element, a number of times that the content element has been shared, and a number of likes associated with the content element.

The method, in one embodiment, includes checking a compression flag associated with a content element. The compression flag may comprise a characteristic of the content element. The content element may be determined to be eligible for compression in response to the compression flag being set. In a further embodiment, the method includes determining an amount of available storage capacity of a data center where the one or more content elements are stored. The amount of available storage capacity may comprise a characteristic of the content element. The compression rates for each of the one or more content elements may be determined as a function of the amount of available storage capacity. In a further embodiment, the method includes determining a storage cost for one or more content elements. The storage cost may comprise a characteristic of the content element. The compression rate for a content element may be determined as a function of a storage cost for the content element.

A program product, in one embodiment, includes a computer readable storage medium that stores code executable by a processor. In one embodiment, the executable code includes code to perform determining one or more content elements that are eligible for compression. A content element may be determined to be eligible for compression based on one or more characteristics of the content element. In some embodiments, the executable code includes to perform determining a compression rate for each of the one or more content elements. The compression rate, in certain embodiments, comprises an amount of compression to be applied to a content element. The amount of compression to be applied to the content element may be determined as a function of one or more characteristics of the content element. In a further embodiment, the executable code includes code to perform compressing each of the one or more eligible content elements according to the determined compression rate.

BRIEF DESCRIPTION OF THE DRAWINGS

A more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which.

DETAILED DESCRIPTION

Figure 1:
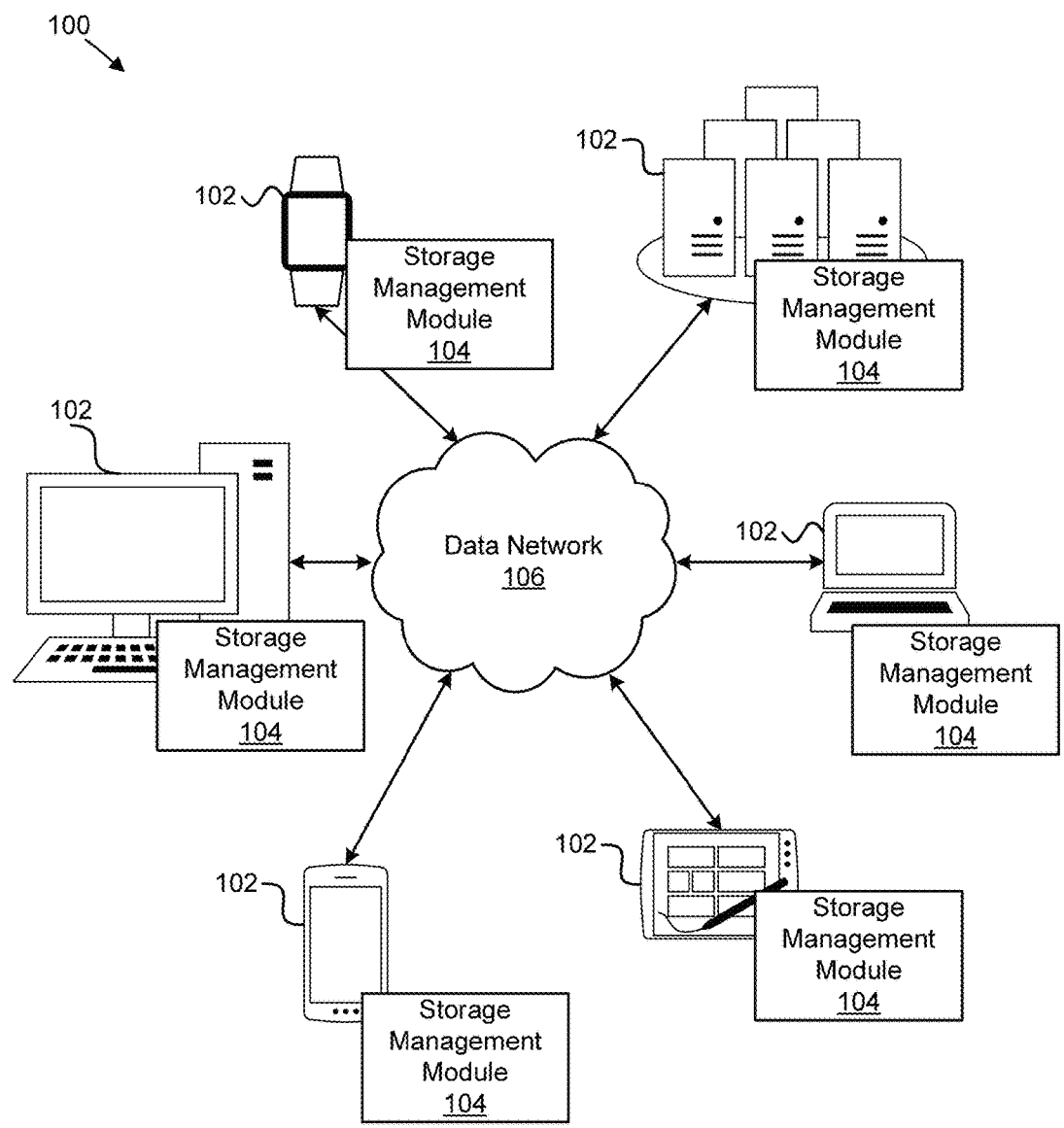
FIG. 1 is a schematic block diagram illustrating one embodiment of a system for managing storage of digital content.

As will be appreciated by one skilled in the art, aspects of the embodiments may be embodied as a system, method or program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a program product embodied in one or more computer readable storage devices storing machine readable code, computer readable code, and/or program code, referred hereafter as code. The storage devices may be tangible, non-transitory, and/or non-transmission. The storage devices may not embody signals. In a certain embodiment, the storage devices only employ signals for accessing code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in code and/or software for execution by various types of processors. An identified module of code may, for instance, comprise one or more physical or logical blocks of executable code which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different computer readable storage devices. Where a module or portions of a module are implemented in software, the software portions are stored on one or more computer readable storage devices.

Any combination of one or more computer readable medium may be utilized. The computer readable medium may be a computer readable storage medium. The computer readable storage medium may be a storage device storing the code. The storage device may be, for example, but not limited to, an electronic, magnetic, optical, electromagnetic, infrared, holographic, micromechanical, or semiconductor system, apparatus, or device, or any suitable combination of the foregoing.

More specific examples (a non-exhaustive list) of the storage device would include the following: an electrical connection having one or more wires, a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Code for carrying out operations for embodiments may be written in any combination of one or more programming languages including an object oriented programming language such as Python, Ruby, Java, Smalltalk, C++, or the like, and conventional procedural programming languages, such as the "C" programming language, or the like, and/or machine languages such as assembly languages. The code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to," unless expressly specified otherwise. An enumerated listing of items does not imply that any or all of the items are mutually exclusive, unless expressly specified otherwise. The terms "a," "an," and "the" also refer to "one or more" unless expressly specified otherwise.

Furthermore, the described features, structures, or characteristics of the embodiments may be combined in any suitable manner. In the following description, numerous specific details are provided, such as examples of programming, software modules, user selections, network transactions, database queries, database structures, hardware modules, hardware circuits, hardware chips, etc., to provide a thorough understanding of embodiments. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

Aspects of the embodiments are described below with reference to schematic flowchart diagrams and/or schematic block diagrams of methods, apparatuses, systems, and program products according to embodiments. It will be understood that each block of the schematic flowchart diagrams and/or schematic block diagrams, and combinations of blocks in the schematic flowchart diagrams and/or schematic block diagrams, can be implemented by code. These code may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the schematic flowchart diagrams and/or schematic block diagrams block or blocks.

The code may also be stored in a storage device that can direct a computer, other programmable data processing apparatus, or other devices to function in a particular manner, such that the instructions stored in the storage device produce an article of manufacture including instructions which implement the function/act specified in the schematic flowchart diagrams and/or schematic block diagrams block or blocks.

The code may also be loaded onto a computer, other programmable data processing apparatus, or other devices to cause a series of operational steps to be performed on the computer, other programmable apparatus or other devices to produce a computer implemented process such that the code which execute on the computer or other programmable apparatus provide processes for implementing the functions/acts specified in the flowchart and/or block diagram block or blocks.

The schematic flowchart diagrams and/or schematic block diagrams in the Figures illustrate the architecture, functionality, and operation of possible implementations of apparatuses, systems, methods and program products according to various embodiments. In this regard, each block in the schematic flowchart diagrams and/or schematic block diagrams may represent a module, segment, or portion of code, which comprises one or more executable instructions of the code for implementing the specified logical function(s).

It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and code.

The description of elements in each figure may refer to elements of proceeding figures. Like numbers refer to like elements in all figures, including alternate embodiments of like elements.

FIG. 1 depicts one embodiment of a system 100 for managing storage of digital content. In one embodiment, the system 100 includes information handling devices 102, storage management modules 104, and data networks 106. In certain embodiments, even though a specific number information handling devices 102, storage management modules 104, and data networks 106 are depicted in FIG. 1, one of skill in the art will recognize that any number of information handling devices 102, storage management modules 104, and data networks 106 may be included in the system 100 for managing storage of digital content.

In one embodiment, the information handling devices 102 include desktop computers, laptop computers, personal digital assistants (PDAs), tablet computers, smart phones, smart televisions (e.g., televisions connected to the Internet), set-top boxes, game consoles, digital cameras, or the like. In some embodiments, the information handling devices 102 comprise wearable devices, such as smart watches, fitness bands, optical head-mounted displays, or the like.

In certain embodiments, the information handling devices 102 include servers, blade servers, virtual servers, cloud servers, servers of a data center, or the like. The servers may be configured as application servers, email servers, database servers, file servers, game servers, home servers, media servers, web servers, and/or the like. In certain embodiments, the servers are communicatively coupled to other information handling devices 102 via the data network 106 such that the information handling devices 102 may store and/or access data on the servers as it relates to the storage management module 104. For example, servers may store digital content elements such as digital images, videos, audio files, documents, and/or the like.

The information handling devices 102 may be configured with a camera, or a similar component, that is configured to capture digital images. The information handling devices 102, in various embodiments, include software and/or hardware for performing digital image processing, such as image compression, image manipulation, image feature detection (e.g., detecting edges, corners, interest points, blobs, ridges, etc.), and/or the like. In a further embodiment, the information handling devices 102 include one or more sensors, such as motion sensors, proximity sensors, accelerometers, orientation sensors, or the like.

In one embodiment, the storage management module 104 is configured to determine one or more content elements that are eligible for compression. In a further embodiment, the storage management module 104 determines a compression rate for each of the one or more content elements. In various embodiments, the storage management module 104 compresses each of the one or more content elements according to the determined compression rate. In this manner, the storage management module 104 may recover storage space by determining content elements that meet certain eligibility criteria, described below, and compressing the determined content elements according to a compression rate determined for each eligible content element, instead of deleting content elements. In one example, a cloud server that stores and serves a digital images for various users may periodically compress images that are older than a threshold age, that have view requests or reviews below a threshold, or the like, to recover available storage space instead of deleting the users' images.

The data network 106, in one embodiment, comprises a digital communication network that transmits digital communications. The data network 106 may include a wireless network, such as a wireless cellular network, a local wireless network, such as a Wi-Fi network, a Bluetooth® network, a near-field communication (NFC) network, an ad hoc network, and/or the like. The data network 106 may include a wide area network (WAN), a storage area network (SAN), a local area network (LAN), an optical fiber network, the internet, or other digital communication network. The data network 106 may include two or more networks. The data network 106 may include one or more servers, routers, switches, and/or other networking equipment. The data network 106 may also include computer readable storage media, such as a hard disk drive, an optical drive, non-volatile memory, random access memory (RAM), or the like.

Figure 2:
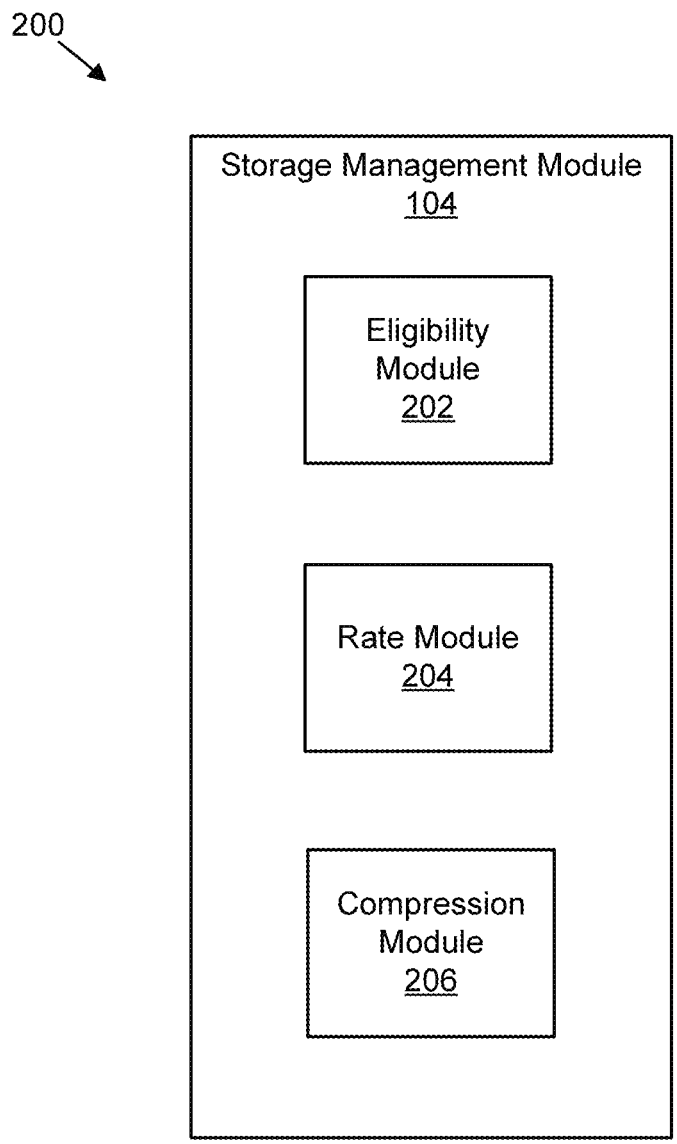
FIG. 2 is a schematic block diagram illustrating one embodiment of a module for managing storage of digital content.

FIG. 2 depicts one embodiment of a module 200 for managing storage of digital content. The module 200, in one embodiment, includes an embodiment of a storage management module 104. The storage management module 104 may include one or more of an eligibility module 202, a rate module 204, and/or a compression module 206, which are described in more detail below.

The eligibility modules 202, in one embodiment, is configured to determine one or more content elements that are eligible for compression. As used herein, a content element may include various types of digital content and multimedia, such as documents, digital images, videos, audio files, or the like. The content elements may be stored locally on an information handling device 102, such as a laptop, a smart phone, a tablet computer, and/or the like. In certain embodiments, the content elements are stored on a remote server, such as a cloud server, a network server, and/or the like. For example, the content elements may be stored on content sharing sites like Flickr®, YouTube®, or the like that allow users to create accounts and upload content to be hosted and shared.

In some embodiments, the eligibility module 202 determines whether a content element is eligible for compression based on one or more factors or characteristics of a content element, such as the age of the content element, the popularity of the content element, the type of account associated with the content element, the cost to store the content element, the amount of storage space available, and/or the like. For example, the eligibility module 202 may determine that a digital image has been stored longer than a threshold age, and therefore is eligible for compression. Similarly, the eligibility module 202 may determine that a video has been viewed less than a viewing threshold, and is therefore eligible for compression. In another example, the eligibility module 202 may determine that the cost of storing an image at its current size is above a threshold cost (e.g., given the age or popularity of the image), and is therefore eligible for compression.

The rate module 204, in one embodiment, is configured to determine a compression rate for each of the one or more content elements. As used herein, a compression rate comprises an amount of compression applied to a content element. In some embodiments, the rate module 204 determines a compression rate specific to each content element that is eligible for compression. For example, the rate module 204 may determine that an image should be compressed 50% while a video stored on the same server should be compressed 35%. In various embodiments, the rate module 204 determines a compression rate for all of the eligible content elements. For example, the rate module 204 may determine that each eligible image stored on the same storage volume should be compressed by 85%.

In some embodiments, the rate module 204 determines a compression rate for a content element based on various factors or characteristics of a content element, such as the age of the content element, the cost to store the content element, the popularity of the content element, or the like. For example, rate module 204 may determine that an image that has been stored for one month should be compressed by 10%, while a different image that has been stored for one year should be compressed by 50%. In another example, a music file that has been stored for two years and has only been downloaded seventy times may be compressed by 90% while a video file that has been stored for two years, but has been viewed over a million times may only be compressed by 5%.

The rate module 204, in some embodiments, may determine a compression rate for a content element based on the type of the content element. For example, images may be compressed at a lesser rate than music files. Similarly, the rate module 204 may determine a compression rate based on how much storage space will be recovered while maintaining a predetermined quality of the content element. For example, an image file may be compressed by 50% while maintaining a quality above a threshold while a video file may only be compressed by 30% to maintain the same amount of quality. The quality of a content element may be measured as a function of the compression method used, the amount that the content element has been compressed from its original size, and/or the like.

The rate module 204 may determine the compression rate for a content element according to a predefined compression scale for the content element. In one embodiment, the rate module 204 assigns a content element a uniform compression scale. For example, a digital image may be assigned a compression scale where the image is compressed in uniform 5% increments. In certain embodiments, the rate module 204 assigns a content element a non-uniform compression scale. For example, a video may be assigned a non-uniform compression scale such that the video is compressed initially in smaller increments (e.g., 2%, 3%, 5%, etc.) and then in larger increments (e.g., 50%, 65%, 80%, etc.) as the video becomes older or less popular or if there is a need to recover more storage space. The rate module 204 may set the compression rate and/or the compression scale for a content element according to user input.

The rate module 204, in one embodiment, determines a compression rate for a content element until the content element has been compressed to a predetermined threshold size, until a predefined amount of storage space has been recovered, until the quality of the content element is at a predefined level, or the like. For example, the rate module 204 may not determine a compression rate for an image that has been compressed to a threshold size of 1.0 KB. In some embodiments, the rate module 204 sends a message, notification, or other indication that the compression rate for the content element cannot be determined because it has reached its threshold size limit. In certain embodiments, the rate module 204 determines a threshold size for content types, such as images, videos, music files, etc. For example, the threshold size for an image may be 1.0 KB, to ensure that the image is still usable, while the threshold size for a video may be 5.0 MB, or the like.

In one embodiment, the compression module 206 is configured to compress each of the one or more eligible content elements according to the compression rate determined by the rate module 204. In certain embodiments, the compression module 206 compresses a content element using a lossy compression algorithm based on the type of the content element. For example, the compression module 206 may compress an image using a JPEG compression algorithm, a video using an MPEG compression algorithm, an audio file using an MP3 compression method, etc.

In one embodiment, the compression module 206 compresses content elements according to a predetermined schedule. For example, the compression module 206 may compress one or more eligible content elements daily, weekly, monthly, semi-annually, annually, or the like. In various embodiments, the compression module 206 determines which storage volume of a plurality of storage volumes to run compression algorithms on according to a predetermined scheme. For example, storage volume A on server X may be compressed on week 1 and storage volume B on server Y may be compressed on week 2. On week 3, storage volume A on server X may be compressed again while storage volume B on server Y may be compressed on week 4, and so on.

Figure 3:
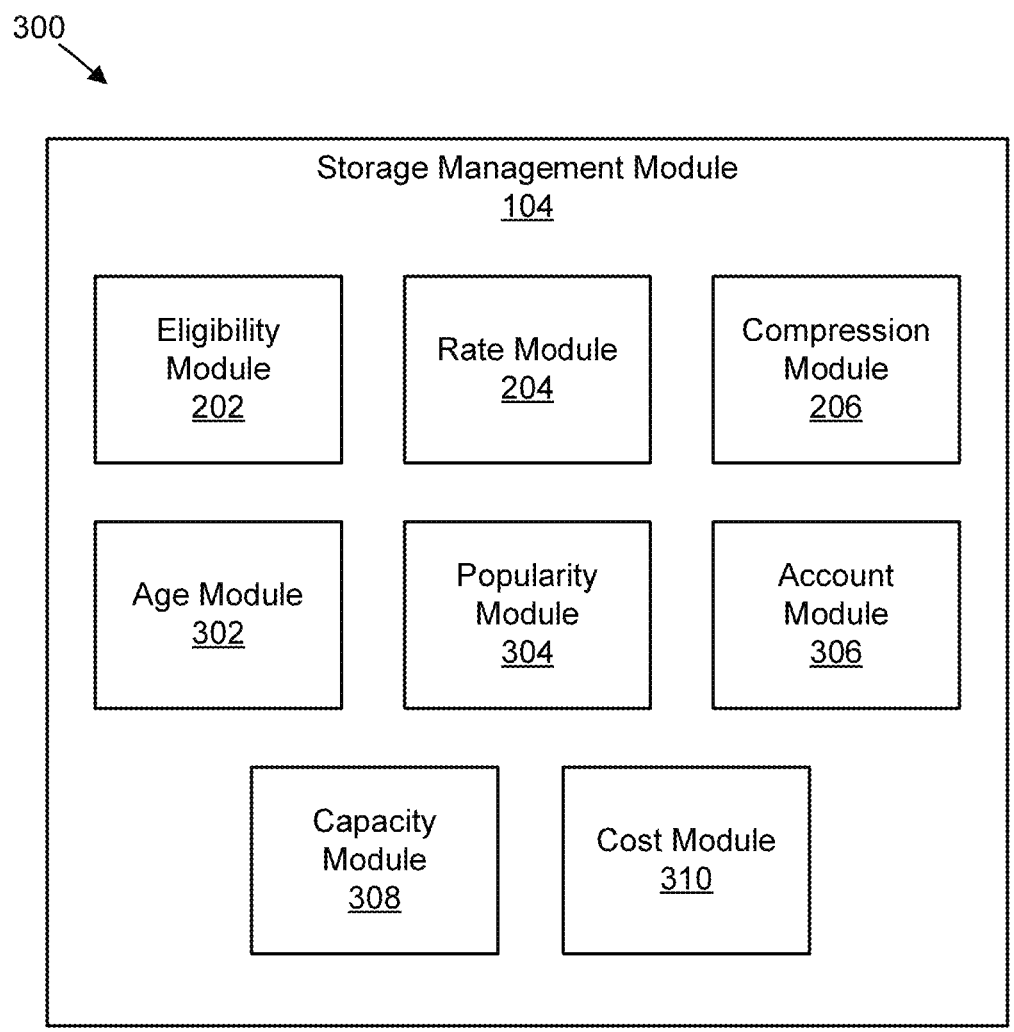
FIG. 3 is a schematic block diagram illustrating one embodiment of another module for managing storage of digital content.

FIG. 3 depicts one embodiment of another module 300 for managing storage of digital content. The module 300, in some embodiments, includes an embodiment of a storage management module 104. The storage management module 104 may include one or more of an eligibility module 202, a rate module 204, and a compression module 206, which may be substantially similar to the eligibility module 202, the rate module 204, and the compression module 206 described above with reference to FIG. 2. The storage management module 104 may also include one or more of an age module 302, a popularity module 304, an account module 306, a capacity module 308, and a cost module 310, which are described in more detail below.

The age module 302, in one embodiment, is configured to determine an age of a content element, which the eligibility module 202 may use to determine whether the content element is eligible for compression. The age of the content element may comprises a characteristic of a content element. As used herein, the age of the content element may comprise an amount of time since the content element was first stored on a storage volume, an amount of time since the content element was created, or the like, and may be indicated by a timestamp associated with the content element. The eligibility module 202 may determine that the content element is eligible for compression in response to the age of the content element exceeding or satisfying a predetermined threshold. For example, the eligibility module 202 may consider content elements older than a threshold age of a year eligible for compression.

For example, the age module 202 may determine the age of a digital image that was uploaded to a server two weeks ago to be two weeks. In another example, the age module 302 may determine that the age of the same digital image is two years if the digital image was created two years ago according to a timestamp or other metadata associated with the content element. Based on the age determined by the age module 202, the rate module 204 may determine the compression rate for a content element as a function of the age. For example, an image that is one year old may be compressed at a higher rate, e.g., 85%, than an image that is one month old, which may be compressed at 5%, or the like.

The popularity module 304, in one embodiment, is configured to determine a popularity of a content element, which the eligibility module 202 may use to determine whether the content element is eligible for compression. The popularity of a content element, as used herein, may be determined based on user feedback associated with the content element. In certain embodiments, the user feedback includes a number of access requests for the content element, a number of views of the content element, a number of downloads of the content element, a number of comments associated with the content element, a number of "likes," "shares," "tweets," "retweets," or the like associated with the content element, or the like. The popularity may comprise a characteristic of a content element. The popularity module 304 may measure the popularity of a content element over a period of time, such as over the past week, month, year, or since the content element has been created or otherwise made available.

For example, the popularity module 304 may determine how many times a video hosted on a video sharing site, such as YouTube®, has been viewed since it was uploaded to YouTube®. In another example, the popularity module 304 may determine how many comments an image posted on Tumblr® receives over the past six months, which may indicate how popular or relevant the image is. The eligibility module 202 may determine that a content element is eligible for compression in response to the popularity of the content element being less than a predetermined threshold. For example, the eligibility module 202 may consider content elements that have view requests, comments, likes or tweets less than a popularity threshold eligible for compression.

Based on the popularity determined by the popularity module 304, the rate module 204 may determine the compression rate for a content element as a function of the popularity. For example, an image that has received ten more comments than the popularity threshold may be compressed at a higher rate, e.g., 85%, than an image that has received a thousand more comments than the popularity threshold, which may be compressed at 5%, or the like. In another example, the rate module 204 may determine the compression rate to by 0% if the popularity of a content element exceeds the popularity threshold such that the compression module 206 does not apply any compression to the content element.

The account module 306, in one embodiment, is configured to check a compression flag associated a content element. The compression flag may comprise a characteristic of a content element. The compression flag indicates to the eligibility module 202 whether the content element is eligible for compression or not, e.g., if the compression flag is set, then the content element is eligible for compression. In certain embodiments, the compression is associated with an account for a user. The user account may be set up by a user on a web site that hosts or stores content uploaded by the user, such as a video sharing site, an image sharing site, a music sharing site, or the like.

As is known in the art, web sites may allow users to create different types of accounts, such as basic or free accounts, or premium accounts that may require a user to pay to access settings, customizations, features, or the like of the web site that are not available to basic or free account holders. In one embodiment, the compression flag may be settable by a user that has a premium account. In this manner, the user can set compression on or off for a content element. For example, if the user uploads an image or video that he does not want to be compressed over a period of time, he can set the compression flag to off, 0, or the like to indicate to the eligibility module 202 that the image or video is not eligible for compression.

In some embodiments, a user may customize the compression rate for content elements associated with the user's account according to the status of the account. For example, premium account holders may specify any compression rate for a video file, from 0% to 100% if desired, which the rate module 204 may use to determine the compression rate for the video file. On the other hand, basic or free account holders may not specify a compression rate for a content element or may only select from one of a plurality of pre-set compression rates, e.g., 5%, 25%, 50%, and 85%.

The capacity module 308, in one embodiment, is configured to determine an amount of available storage capacity of a data center where the one or more content elements are stored. The amount of available storage capacity may comprise a characteristic of a content element. As used herein, the available storage capacity comprises an amount of storage capacity of the total capacity for a data center, a server, a storage volume, or the like, that is unused or otherwise available for use. For example, a data center may have a total capacity of 100 TB and an available capacity of 20 TB.

In certain embodiments, the compression rates for each of the one or more content elements are determined as a function of the amount of available storage capacity. In one example, if the amount of available storage capacity drops below a predetermined threshold, the compression rates for the content elements may be increased to recover more storage capacity. Similarly, if the capacity module 308 determines the amount of available storage capacity is greater than a predetermined threshold, the rate module 204 may decrease the compression rate for each of the content elements (potentially to 0%). The rate module 204 may determine an appropriate compression rate for a content element based on the available storage capacity and any of the previous factors discussed above, e.g., the age of the content element, the popularity of the content element, etc.

In certain embodiments, the capacity module 308 forecasts an amount of storage capacity that may be required at a point in the future based on historical storage data. For example, the capacity module 308 may determine that above-average amounts of content elements are uploaded during the Christmas season than at other times of the year. Accordingly, the capacity module 308, based on historical storage needs around Christmas time, may forecast how much available storage is going to be necessary to service uploads during that period of time and the rate module 204 may set the compression rates for the existing content elements accordingly, e.g., the rate module 204 may increase the compression rates for content elements to recover more storage capacity to anticipate the increase for the upcoming time period.

The cost module 310, in one embodiment, is configured to determine a storage cost associated with one or more content elements. The storage cost associated with a content element may comprise a characteristic of the content element. As used herein, the storage cost of a content element may comprise all the associated costs, both fixed and variable costs, on a per-byte-basis, e.g., cost per TB, GB, MB, KB, etc. For example, it may cost $0.5 per day to store and host an image on an image sharing platform, which may include the power consumption costs as well as the hardware costs to host the image.

In some embodiments, the rate module 204 determines a compression rate for one or more content elements as a function of the storage costs for the one or more content elements. For example, the rate module 204 may set the compression rate for a video to 50% to reduce the cost of storing the video below a cost threshold. As expenses change, such as the cost of power and storage hardware, it may become more or less expensive to store digital content. The rate module 204 adjusts the compression rates according to the storage costs determined by the cost module 310 to meet a predetermined cost threshold. The cost threshold may comprise a cost for a particular file type, a cost per storage unit (e.g., byte), a cost for an entire data center, or the like. For example, the rate module 204 may determine a compression rate for one or more content elements based on the threshold cost for a storage volume; in other words, the rate module 204 may determine a compression rate for one or more content elements such that the cost of storing the one or more cost elements meets the cost threshold.

Figure 4:
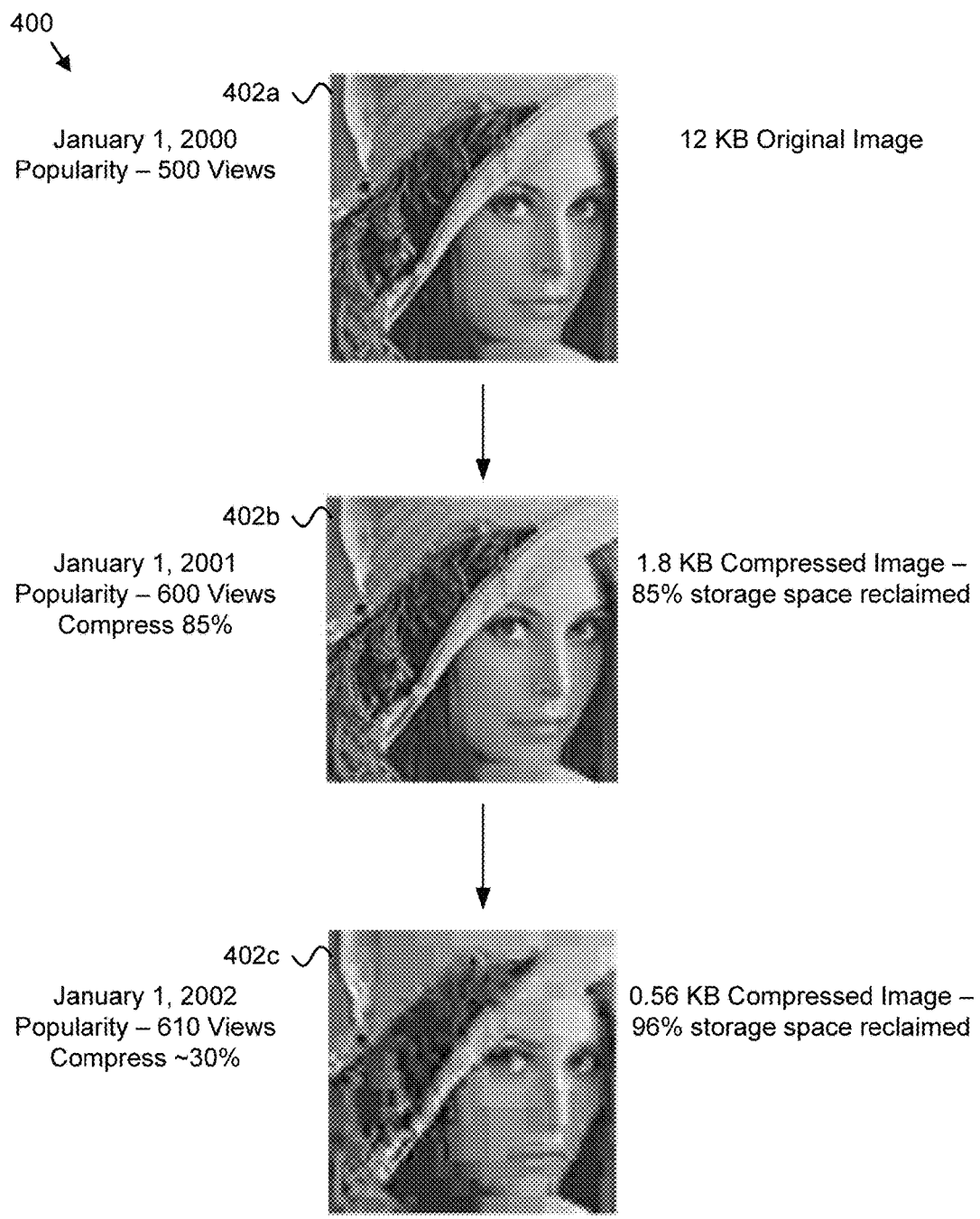
FIG. 4 is a schematic block diagram illustrating one embodiment of managing storage of a digital image.

FIG. 4 depicts one embodiment 400 of managing storage of a digital image. In one embodiment, an image 402a is stored on a storage volume in its original format and size—12 KB. The image is stored on Jan. 1, 2000 and during the year receives 500 view requests. On Jan. 1, 2001—one year after the image 402a was stored on the storage volume, the eligibility module 202 may determine whether the image is eligible for compression.

The eligibility module 202 may determine that the image 402a is eligible for compression in response to the image 402a being a year old, which may exceed the threshold age for a content element of its type. In another embodiment, the eligibility module 202 may determine that the number of page views for the image 402a during the year, e.g., 500 views, is below a popularity threshold and is therefore eligible for compression. Accordingly, the rate module 204 may determine a compression rate for the image 402a, such as 85%, which reduces the size of the image 402a to 1.8 KB and recovers 85% of the storage capacity consumed by the image 402a. The rate module 204 may determine the compression rate according to a number of factors, such as the age of the image 402a, the popularity of the image 402a, the storage constraints of the storage volume, etc., while also maintaining a quality level such that the image 402a is still usable.

The compression module 206 compresses the image 402a to generate a compressed image 402b using a lossy compression method. On Jan. 1, 2002, the eligibility module 202 determines whether the image is eligible for compression again, which may be based on the age of the image 402b (e.g., 2 years) or the number of total view requests (e.g., 600 views since January 2000), or the like. The rate module 204 determines another compression rate for the image 402b and the compression module 206 compresses the image 402b to create another compressed image 402c. In this manner, over time, storage capacity may be recovered by gradually compressing content elements, such as images, without requiring deletion of the content elements.

Figure 5:
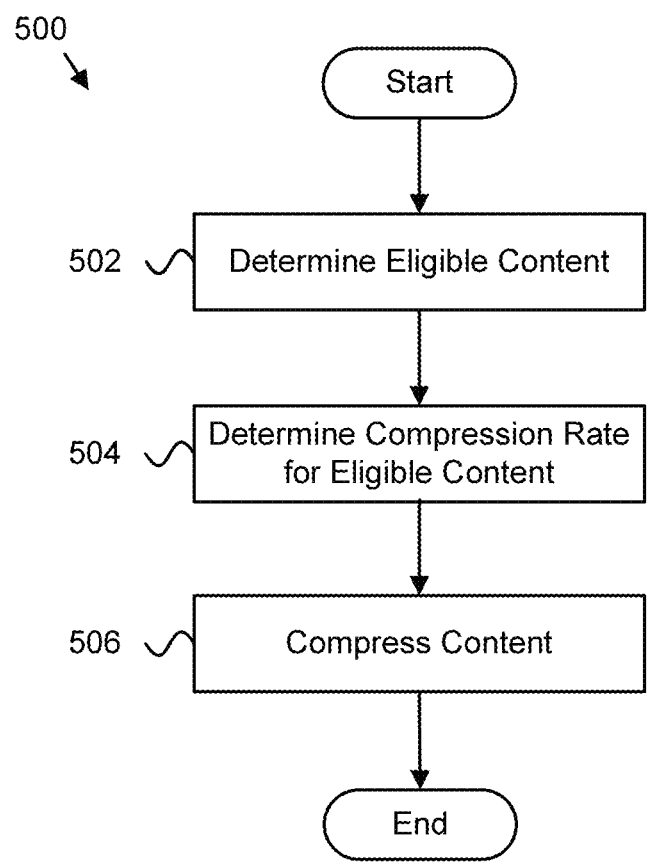
FIG. 5 is a schematic flow chart diagram illustrating one embodiment of a method for managing storage of digital content.

FIG. 5 depicts a flow chart diagram illustrating one embodiment of a method 500 for managing storage of digital content. In certain embodiments, the method 500 begins, and the eligibility module 202 determines 502 one or more content elements that are eligible for compression based on various factors associated with the content element. The factors may include the age of the content element, the popularity of the content element, the type of account associated with the content element, or the like. For example, the eligibility module 202 may determine 502 that any content element that is older than a year is eligible for compression. Likewise, the eligibility module may determine 502 that any videos that have less than 1,000 views in the past three months are eligible for compression.

The rate module 204, in a further embodiment, determines 504 a compression rate for each of the one or more content elements. The compression rate may also be based on various factors, such as the age of the content element, the popularity of the content element, the type of account associated with the content element, the cost of storing the content element, the storage capacity needs of the storage volume where the content element is stored, or the like. Accordingly, based on one or more of these factors, the rate module 204 may determine 504 a compression rate for a content element that recovers storage capacity while also maintain some level of quality for the content element such that the content element is usable.

In various embodiments, the compression module 206 compresses 506 each of the one or more content elements according to the determined compression rate. The compression module 206 may use a lossy compression algorithm based on the type of the content element. For example, an image may be compressed using a JPEG method, a video may be compressed using an MPEG method, or the like, and the method 500 ends.

Embodiments may be practiced in other specific forms. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus comprising:
a processor;
a memory that stores code executable by the processor, the code comprising:
code that determines an age of each of one or more content elements, the age of a content element determined based on an amount of time since the content element was originally created;
code that determines a number of times that each of the one or more content elements is accessed;
code that determines one or more content elements that are eligible for compression in response to the determined age of each of the one or more content elements exceeding a threshold age and the determined number of times that each of the one or more content elements is accessed being less than an access threshold;
code that determines a compression rate for each of the one or more content elements as a function of the age of the content element such that older content elements are compressed at a higher rate than younger content elements, and as a function of the number of times that that the content element is accessed such that less accessed content elements are compressed at a higher rate than more accessed content elements, the compression rate comprising an amount of compression to be applied to a content element; and
code that compresses each of the one or more eligible content elements according to the determined compression rate.

2. The apparatus of claim 1, wherein the popularity of the content element is determined based on user feedback associated with the content element, the user feedback comprising one or more of:
a number of comments associated with the content element;
a number of times that the content element has been shared; and
a number of likes associated with the content element.

3. The apparatus of claim 1, further comprising code that checks a compression flag associated with a content element, the compression flag comprising a characteristic of the content element, wherein the content element is determined to be eligible for compression in response to the compression flag being set.

4. The apparatus of claim 3, wherein the compression flag is associated with an account for an owner of the content element, the compression flag being settable by the owner in response to a type of the account comprising a premium account.

5. The apparatus of claim 4, wherein the compression rate is customizable by an owner of a content element that has a premium account.

6. The apparatus of claim 1, further comprising code that determines an amount of available storage capacity of a data center where the one or more content elements are stored, the amount of available storage capacity comprising a characteristic of a content element, wherein the compression rates for each of the one or more content elements are determined as a function of the amount of available storage capacity.

7. The apparatus of claim 1, further comprising code that determines a storage cost for one or more content elements, the storage cost comprising a characteristic of a content element, wherein the compression rate for a content element is determined as a function of a storage cost for the content element.

8. The apparatus of claim 1, wherein the one or more content elements comprise one or more of a document, a digital photograph, a video, and an audio file.

9. A method comprising:
   determining, by a processor, an age of each of the one or more content elements, the age of a content element determined based an amount of time since the content element was originally created;
   determining a number of times that each of the one or more content elements is accessed;
   determining one or more content elements that are eligible for compression in response to the determined age of each of the one or more content elements exceeding a threshold age and the determined number of times that each of the one or more content elements is accessed being less than an access threshold;
   determining a compression rate for each of the one or more content elements as a function of the age of the content element such that older content elements are compressed at a higher rate than younger content elements, and as a function of the number of times that that the content element is accessed such that less accessed content elements are compressed at a higher rate than more accessed content elements, the compression rate comprising an amount of compression to be applied to a content element; and
   compressing each of the one or more eligible content elements according to the determined compression rate.

10. The method of claim 9, wherein the popularity of the content element is determined based on user feedback associated with the content element, the user feedback comprising one or more of:
   a number of comments associated with the content element;
   a number of times that the content element has been shared; and
   a number of likes associated with the content element.

11. The method of claim 9, further comprising checking a compression flag associated with a content element, the compression flag comprising a characteristic of the content element, wherein the content element is determined to be eligible for compression in response to the compression flag being set.

12. The method of claim 9, further comprising determining an amount of available storage capacity of a data center where the one or more content elements are stored, the amount of available storage capacity comprising a characteristic of a content element, wherein the compression rates for each of the one or more content elements are determined as a function of the amount of available storage capacity.

13. The method of claim 9, further comprising determining a storage cost for one or more content elements, the storage cost comprising a characteristic of a content element, wherein the compression rate for a content element is determined as a function of a storage cost for the content element.

14. A program product comprising a computer readable storage medium that is not a transitory signal and stores code executable by a processor, the executable code comprising code to perform:
   determining an age of each of one or more content elements, the age of a content element determined based on an amount of time since the content element was originally created;
   determining a number of times that each of the one or more content elements is accessed;
   determining one or more content elements that are eligible for compression in response to the determined age of each of the one or more content elements exceeding a threshold age and the determined number of times that each of the one or more content elements is accessed being less than an access threshold;
   determining a compression rate for each of the one or more content elements as a function of the age of the content element such that older content elements are compressed at a higher rate than younger content elements, and as a function of the number of times that that the content element is accessed such that less accessed content elements are compressed at a higher rate than more accessed content elements, the compression rate comprising an amount of compression to be applied to a content element; and
   compressing each of the one or more eligible content elements according to the determined compression rate.

* * * * *